(12) United States Patent
Matsumoto et al.

(10) Patent No.: US 9,362,966 B1
(45) Date of Patent: Jun. 7, 2016

(54) BIDIRECTIONAL PORTS FOR MULTI-TUNER BACKGROUND RADIOS

(71) Applicant: QUALCOMM Technologies International, Ltd., Cambridge (GB)

(72) Inventors: Charles Matsumoto, Chandler, AZ (US); Noshir Dubash, Phoenix, AZ (US); Michael Schödel, Ingolstadt (DE); Jeff Koeller, Mesa, AZ (US); Luis Briones, Chandler, AZ (US)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 0 days.

(21) Appl. No.: 14/674,550

(22) Filed: Mar. 31, 2015

(51) Int. Cl.
*H04B 1/10* (2006.01)
*H04B 1/18* (2006.01)
*H03F 3/191* (2006.01)

(52) U.S. Cl.
CPC .............. *H04B 1/1027* (2013.01); *H03F 3/191* (2013.01); *H04B 1/18* (2013.01); *H03F 2200/451* (2013.01)

(58) Field of Classification Search
CPC combination set(s) only.
See application file for complete search history.

(56) References Cited

U.S. PATENT DOCUMENTS 9,178,592 B1 * 11/2015 Djadi .................. H04B 7/06

* cited by examiner

*Primary Examiner* — Junpeng Chen
(74) *Attorney, Agent, or Firm* — Procopio, Cory, Hargreaves & Savitch LLP

(57) ABSTRACT

Tuners, multi-tuner receivers and methods of configuring multiple tuners are provided. A tuner on an integrated circuit includes an RF amplifier configured to be coupled to an antenna to amplify an RF signal received from the antenna, a bidirectional port configured to be coupled to another tuner and a bidirectional port circuit coupled between the RF amplifier and the bidirectional port. The bidirectional port circuit includes signal routing circuitry and a programmable control that is configured to control the signal routing circuitry to implement one of an input port, an output port or a disabled port.

20 Claims, 9 Drawing Sheets

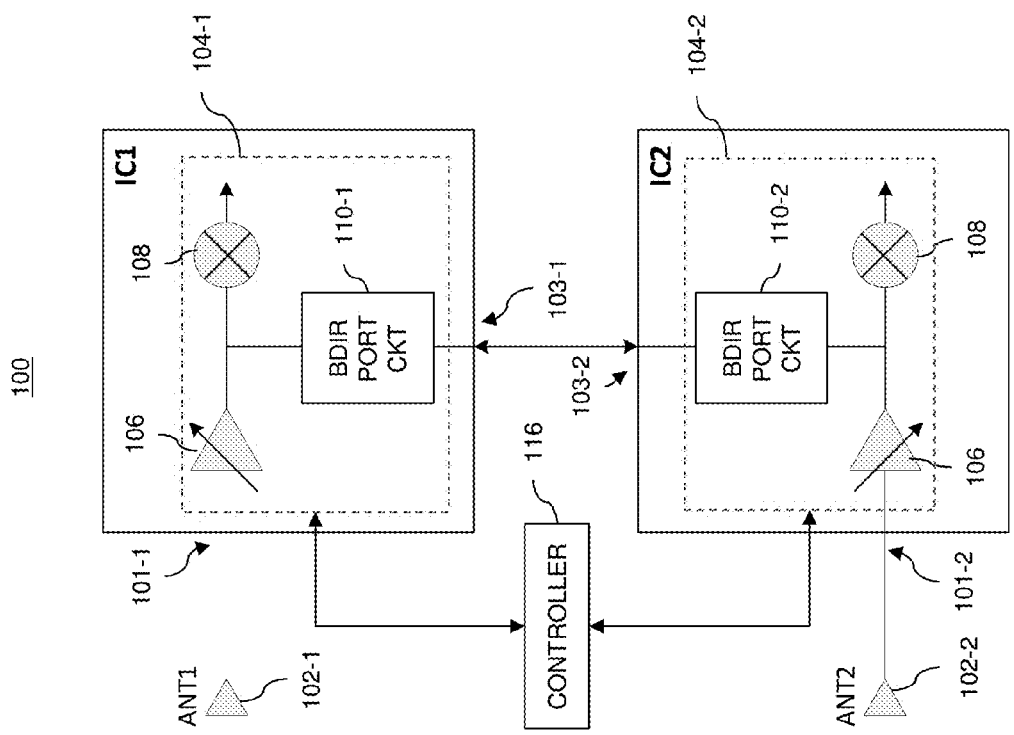
FIG. 1

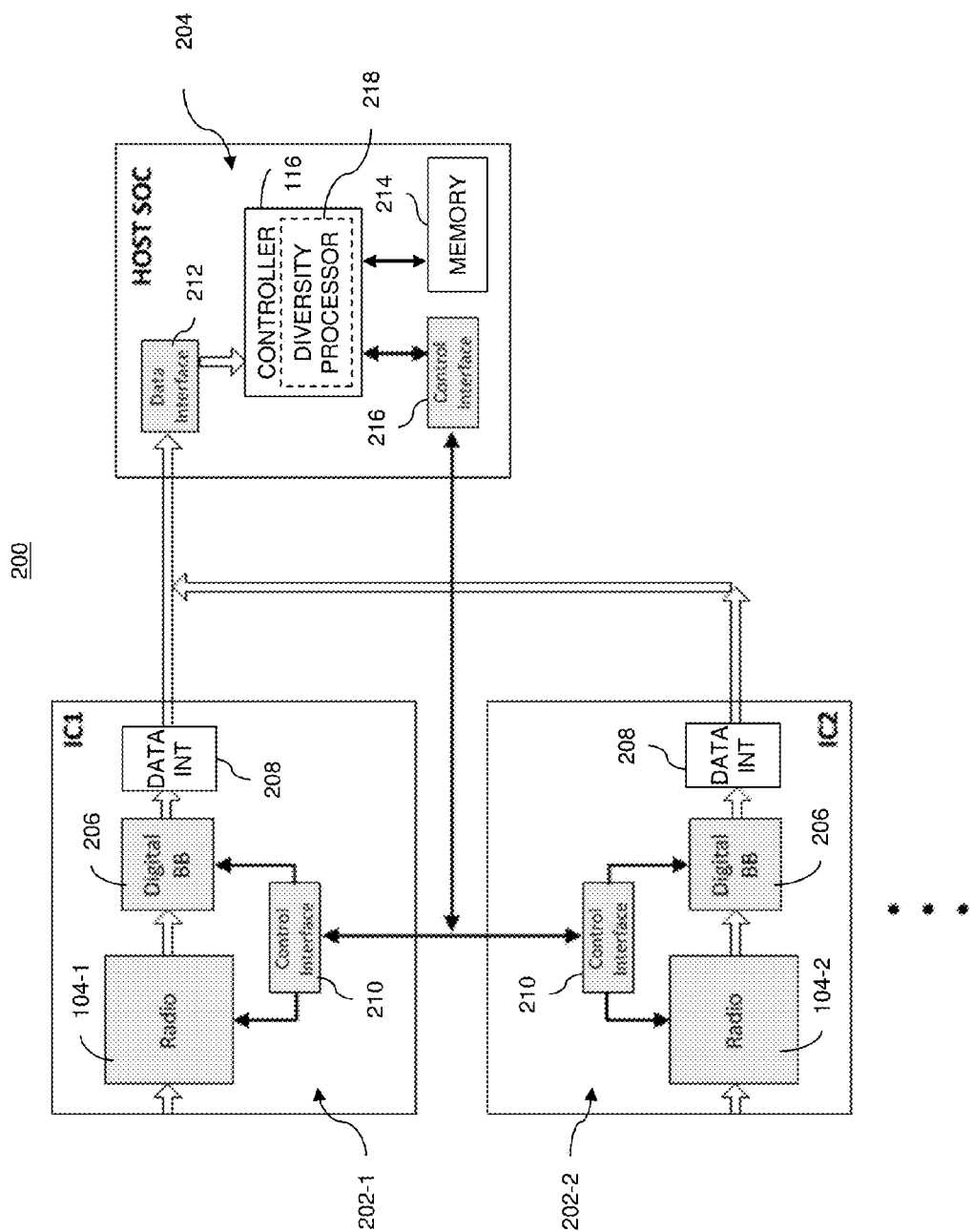
FIG. 2

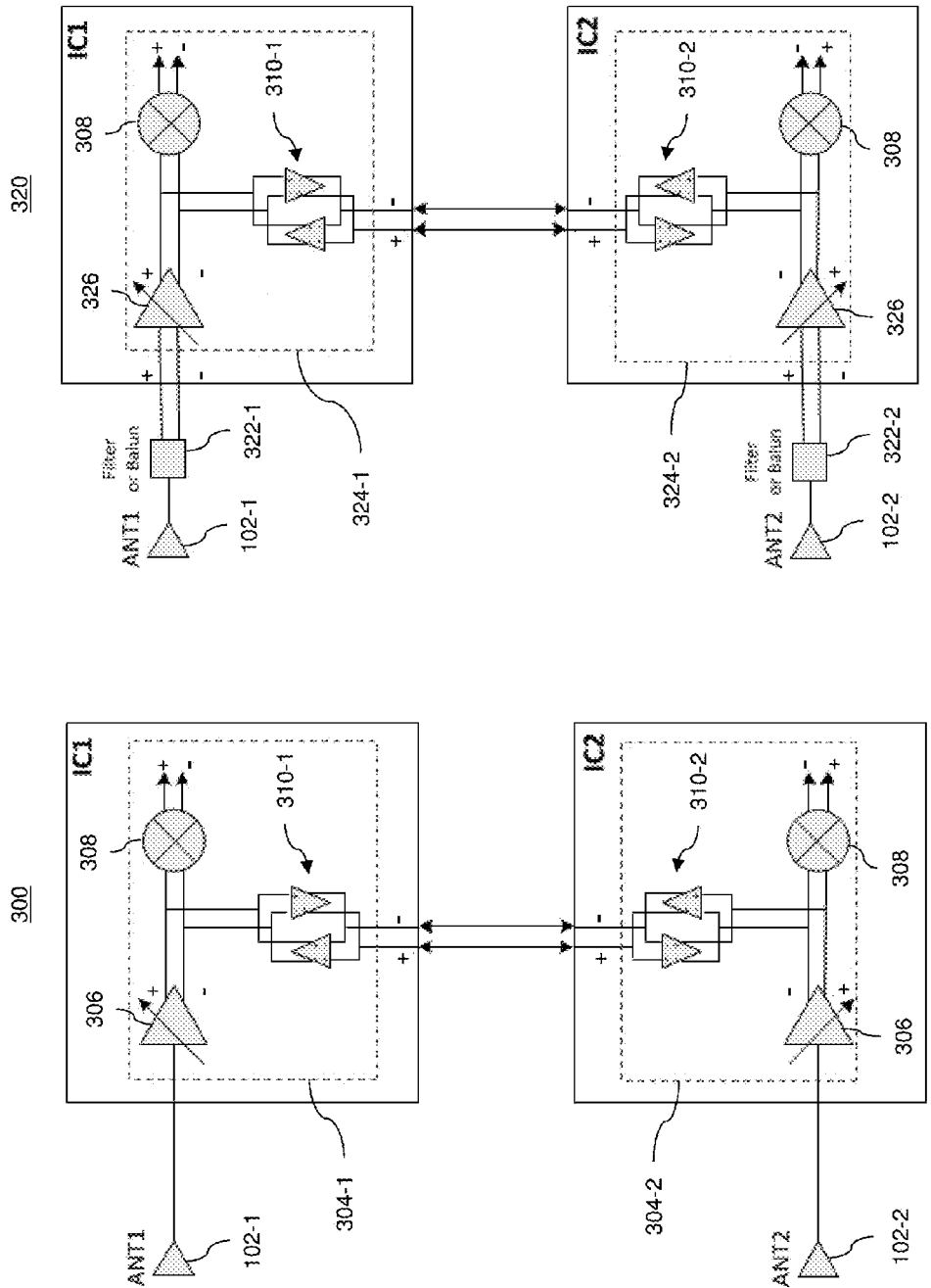
FIG. 3B
FIG. 3A

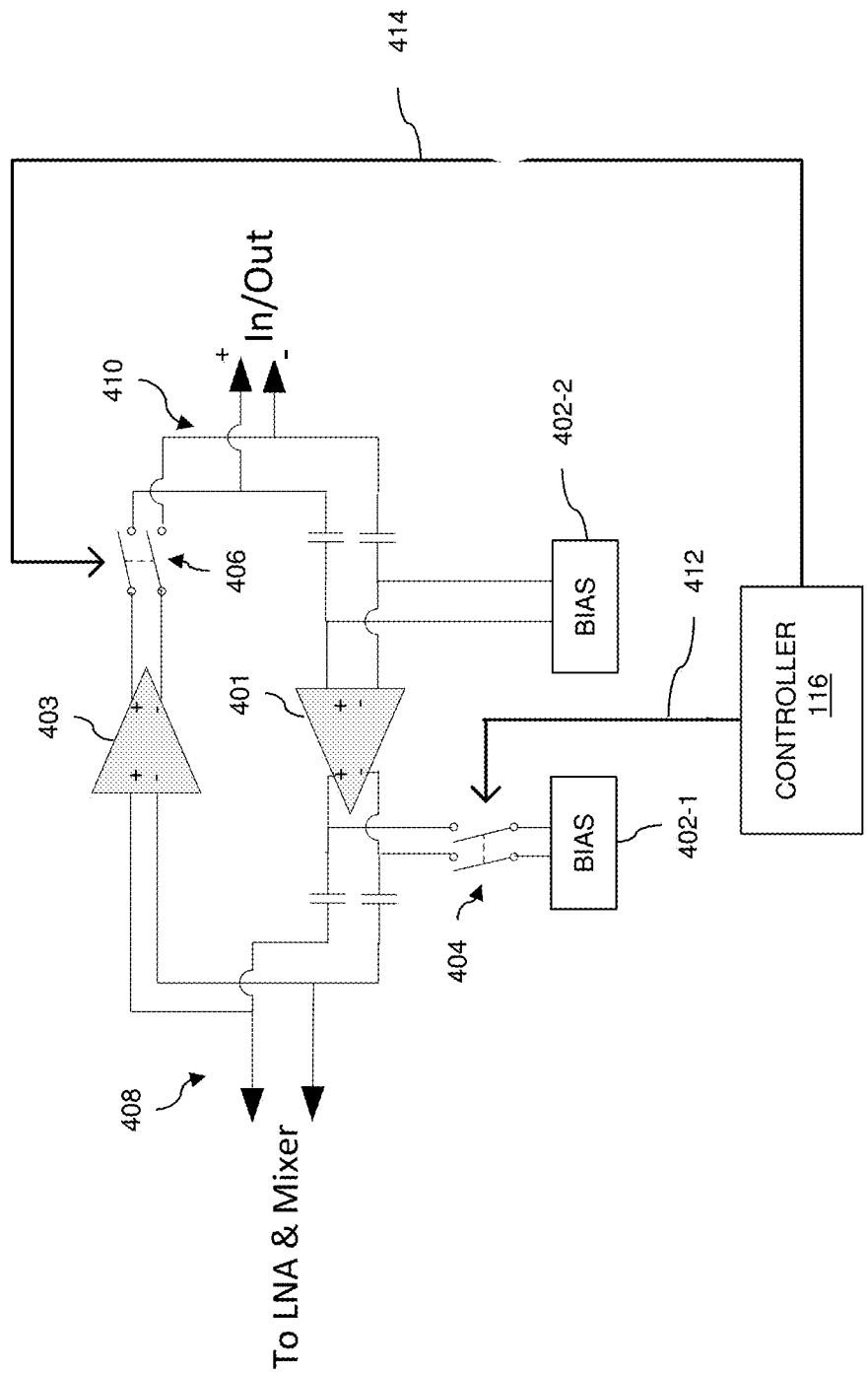
FIG. 4A

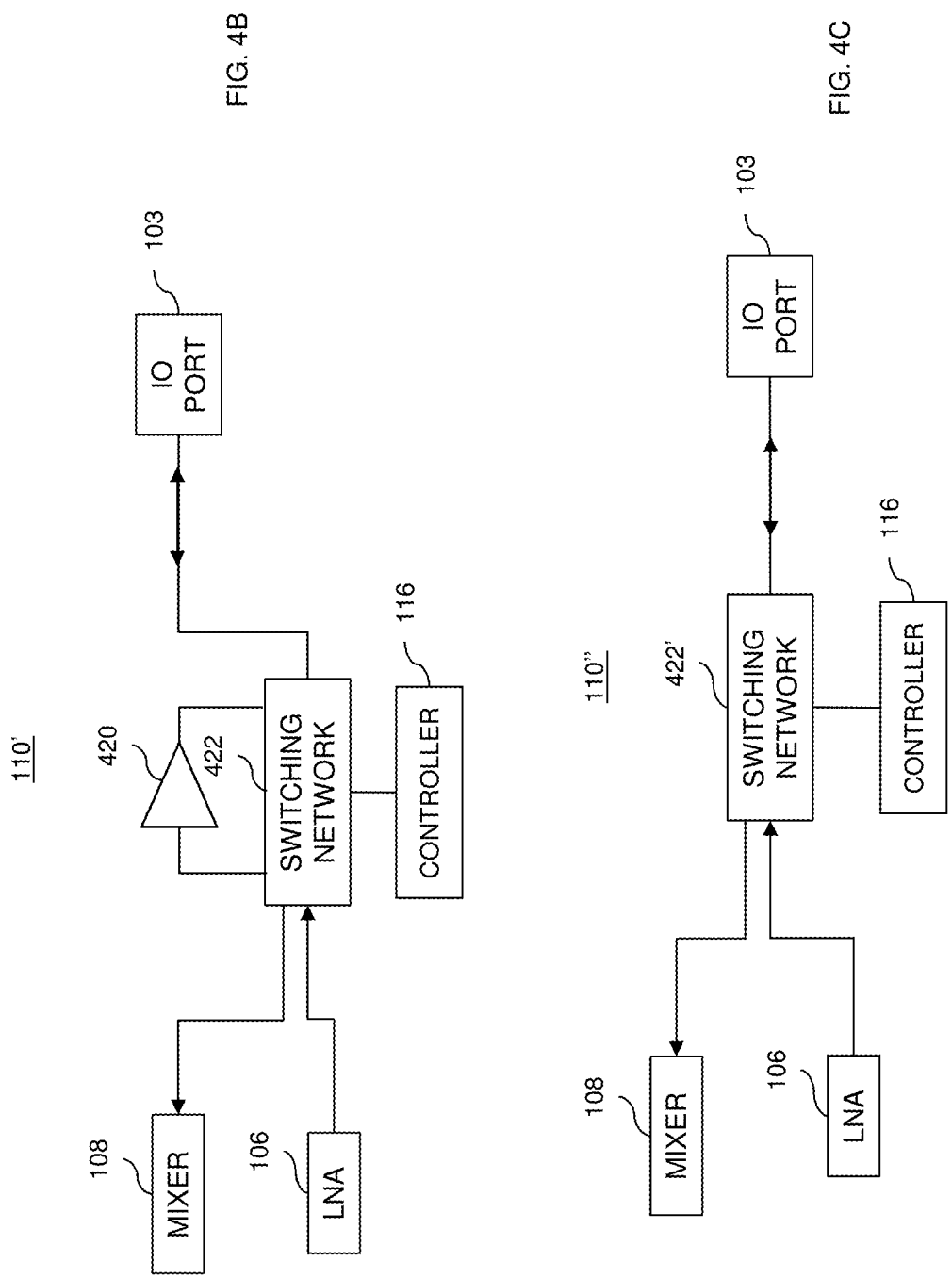

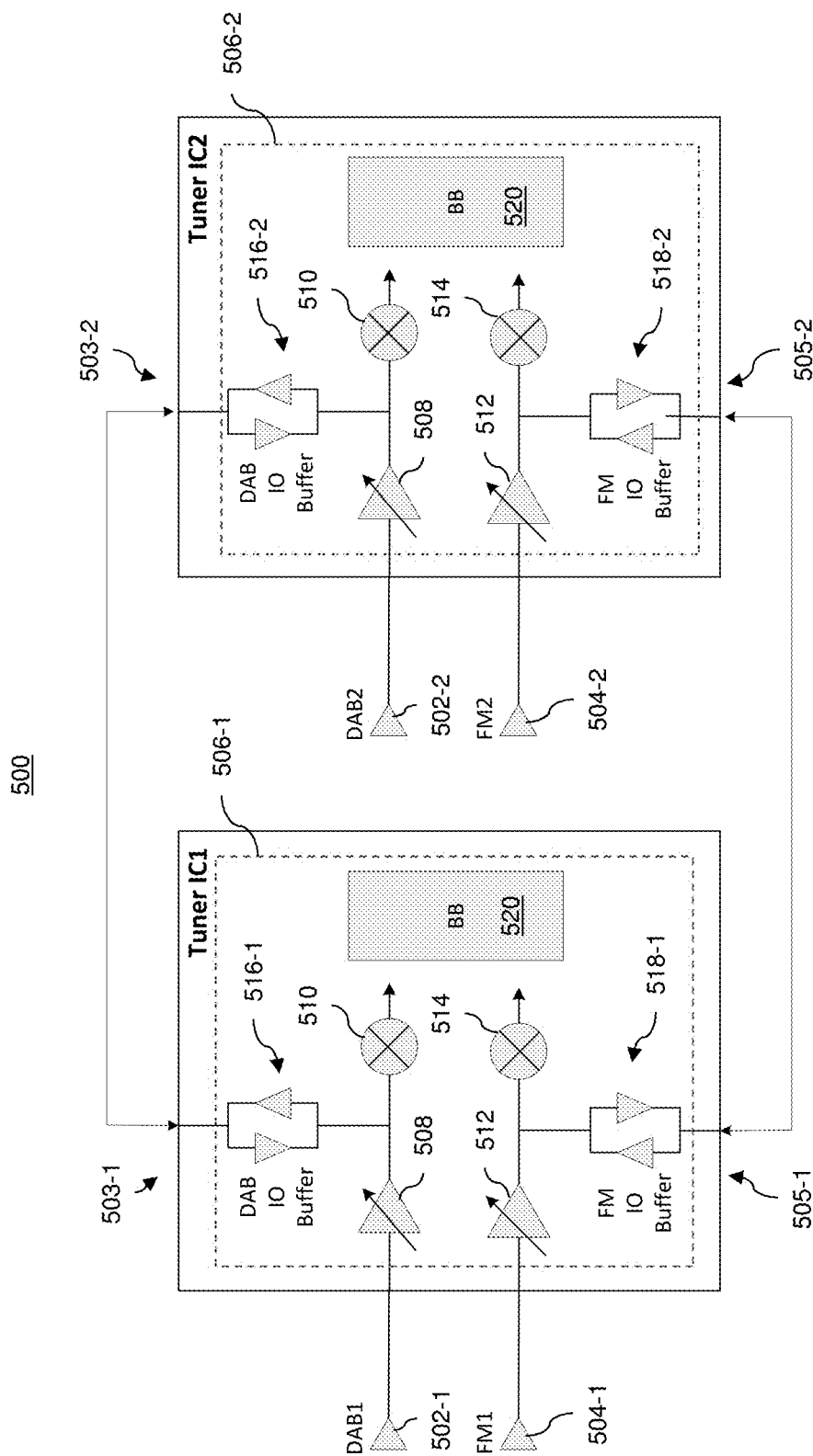
FIG. 5

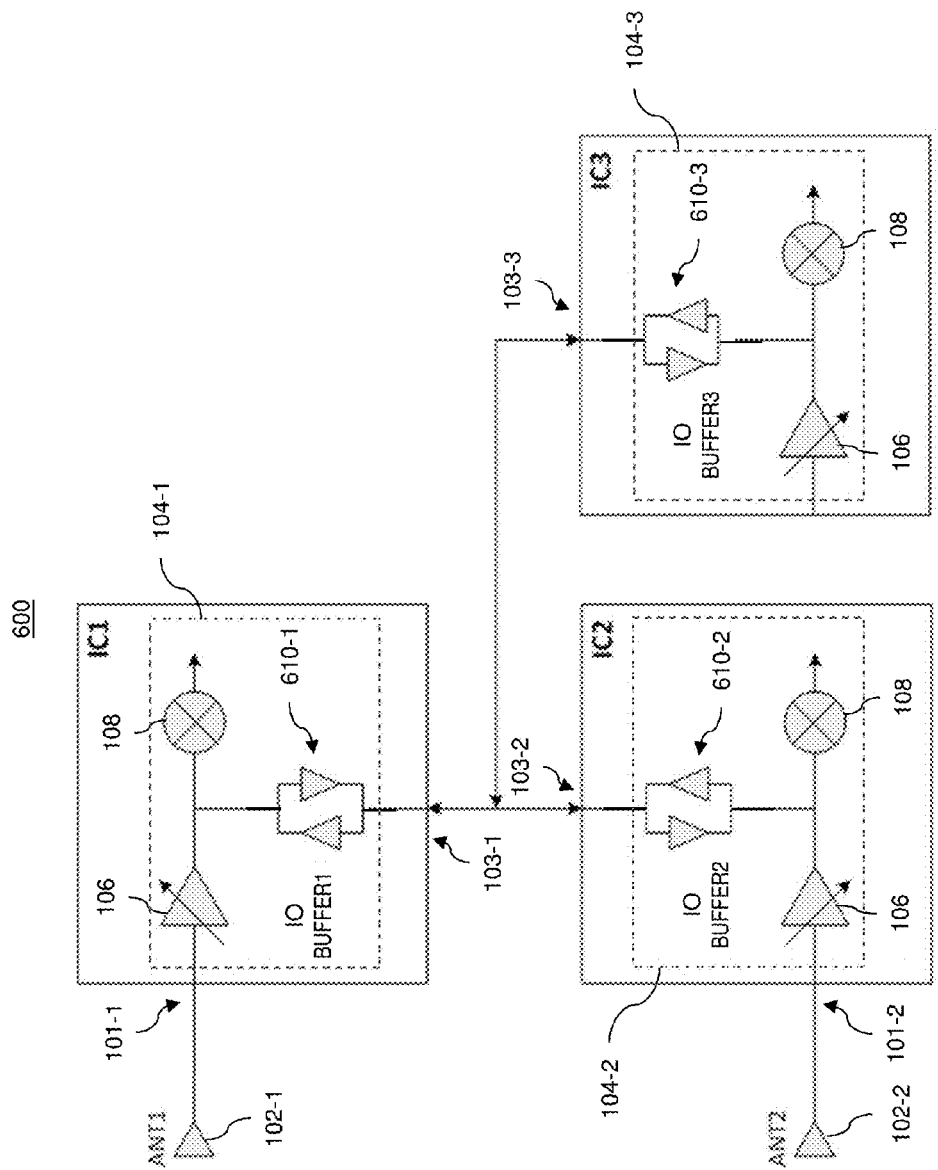
FIG. 6

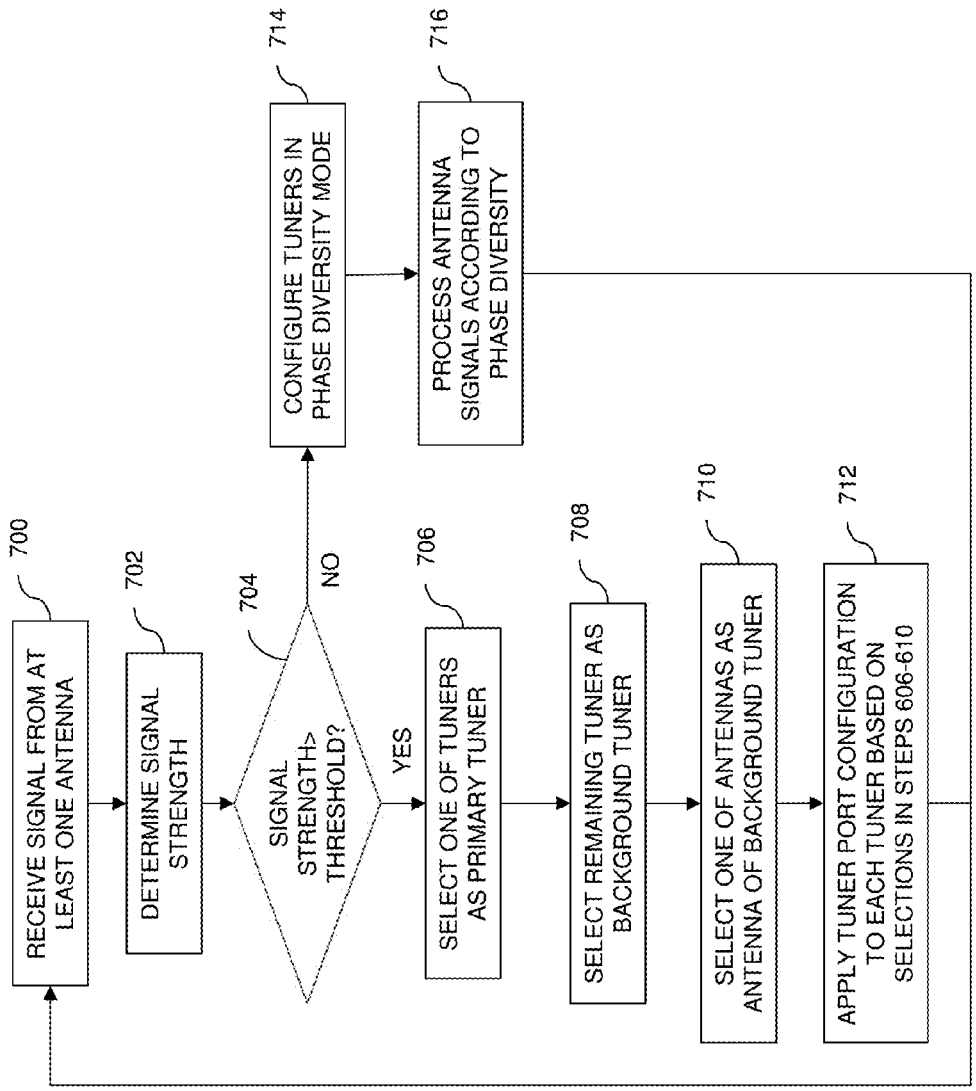
FIG. 7

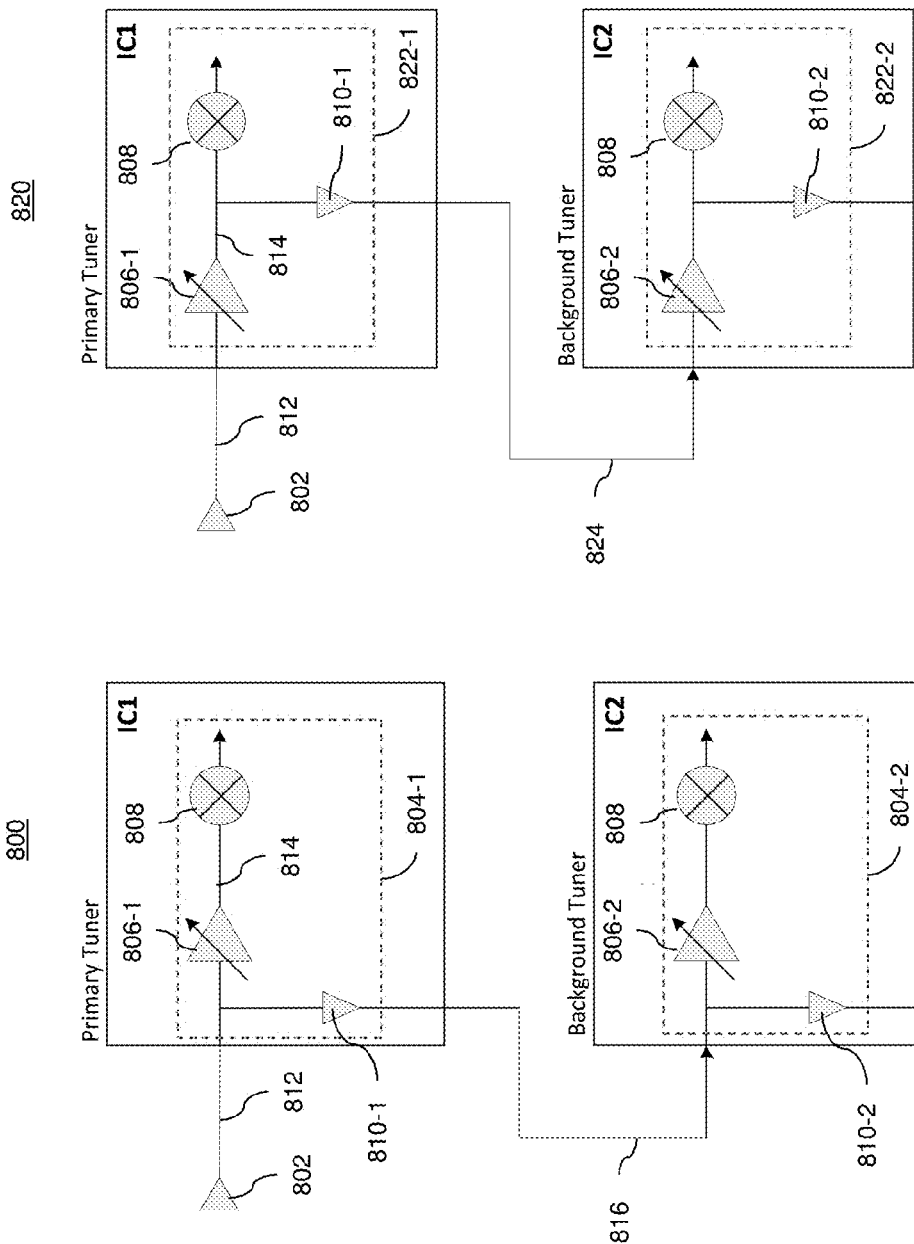
PRIOR ART
FIG. 8B
PRIOR ART
FIG. 8A

BIDIRECTIONAL PORTS FOR MULTI-TUNER BACKGROUND RADIOS

FIELD

The described embodiments relate to radio frequency receivers and, more particularly, to multi-tuner automotive radio receivers with bidirectional ports.

BACKGROUND

Automotive radios have evolved into sophisticated infotainment systems, capable of providing content (e.g., audio content, video content, navigation and/or traffic information) from a number of sources. Some automotive radios include two tuners, a primary tuner and a background tuner. The primary tuner may be used to receive a broadcast via a frequency channel. The background tuner is often used to find alternate frequency channels for the same broadcast. The alternate frequency channel may be used, for example, to improve reception quality or for a geographical transfer of the broadcast as the vehicle approaches an alternate transmitter. Background tuners may also be used to build and maintain lists of available channels, as well as harvest digital data for a variety of applications. For example, a background tuner may harvest traffic information to aid a navigation device or may harvest news services for presentation on a display device.

SUMMARY

The described embodiments relate to tuners, multi-tuner receivers and methods of configuration of multiple tuners of a receiver. An example tuner on an integrated circuit includes a radio frequency (RF) amplifier configured to be coupled to an antenna to amplify an RF signal received from the antenna; a bidirectional port configured to be coupled to another tuner; and a bidirectional port circuit coupled between the RF amplifier and the bidirectional port. The bidirectional port circuit includes signal routing circuitry and a programmable control that is configured to program the signal routing circuitry of the bidirectional port circuit to implement one of an input port, an output port or a disabled port.

An example multi-tuner receiver includes a controller and first and second tuners coupled to respective first and second antennas and to the controller. Each tuner includes an RF amplifier configured to amplify a received RF signal from a corresponding one of the first and second antennas and a bidirectional port circuit coupled between the corresponding RF amplifier and a bidirectional port of the other tuner. The bidirectional port circuit includes signal routing circuitry and a programmable control configured to program the signal routing circuitry of the respective bidirectional port circuit to implement one of an input port, an output port or a disabled port. The first tuner is coupled to the second tuner via their respective bidirectional ports. The controller is configured to select a tuner port configuration of each of the first tuner and the second tuner based on an associated receiver operation state. For each tuner, the controller is configured to program the signal routing circuitry, based on the selected tuner port configuration.

An example method for configuring two tuners of a receiver includes selecting, by a controller, a tuner port configuration for an associated receiver operation state. Each tuner includes an RF amplifier configured to amplify an RF signal from a corresponding antenna, and a bidirectional port circuit coupled between the corresponding RF amplifier and a bidirectional port of the respective tuner. Each bidirectional port circuit includes signal routing circuitry and a programmable control configured to control the respective signal routing circuitry. The two tuners are coupled together via their respective bidirectional ports. A control signal is sent by the controller to each tuner of the two tuners to program each tuner based on the selected port configuration. Each tuner is configured, responsive to the respective control signal, to control the signal routing circuitry to implement one of an input port, an output port or a disabled port. At least one received RF signal is directed among the two tuners responsive to configuring each tuner.

BRIEF DESCRIPTION OF THE DRAWINGS

The embodiments may be understood from the following detailed description when read in connection with the accompanying drawing. It is emphasized, according to common practice, that various features of the drawing may not be to scale. On the contrary, the dimensions of the various features may be arbitrarily expanded or reduced for clarity. Moreover, in the drawing, common numerical references are used to represent like features. Included in the drawing are the following figures:

FIG. 1 is a functional block diagram of a portion of a multi-tuner receiver, according to an embodiment;

FIG. 2 is a functional block diagram of a portion of a multi-tuner receiver, illustrating control and data bus connections between various components, according to an embodiment;

FIGS. 3A and 3B are functional block diagrams of portions of differential multi-tuner receivers, according to different embodiments;

FIG. 4A is a circuit diagram of a bidirectional port circuit of the portions of the receivers shown in FIGS. 3A and 3B;

FIGS. 4B and 4C are functional block diagrams of example bidirectional port circuits, according to different embodiments;

FIG. 5 is a functional block diagram of a portion of a multiband multi-tuner receiver, according to an example embodiment;

FIG. 6 is a functional block diagram of a portion of a multi-tuner receiver with phase diversity and background antenna switching, according to an embodiment;

FIG. 7 is a flow chart diagram of a method for switching a multi-tuner receiver between phase diversity and background tuner modes, according to an embodiment; and FIGS. 8A and 8B are functional block diagrams of portions of conventional radio frequency (RF) receivers having a background tuner.

DETAILED DESCRIPTION

FIG. 8A is a functional block diagram of an example conventional multi-tuner receiver 800. Receiver 800 includes antenna 802 for receiving RF signal 812, primary tuner 804-1 on a first integrated circuit (IC1) and background tuner 804-2 on a second IC (IC2). Primary tuner 804-1 is electrically connected to background tuner 804-2 via output buffer amplifier 810-1 of primary tuner 804-1.

Primary tuner 804-1 includes low noise amplifier (LNA) 806-1, mixer 808 and output buffer amplifier 810-1. Although not shown, LNA 806-1 may also include an RF automatic gain controller (AGC). Background tuner 804-2 includes a similar configuration.

Primary tuner 804-1 may be electrically coupled to antenna 802 via LNA 806-1, to receive RF signal 812. LNA 806-1 may amplify received RF signal 812 to form amplified signal

814. Mixer 808 may be configured to down-convert the amplified RF signal 814 to a lower frequency band (such as an intermediate frequency (IF) band) for processing. Primary tuner 804-1 may include additional components (not shown), such as a local oscillator (LO), IF filters (e.g., for channel selection), variable gain amplifiers (VGAs) and analog-to-digital (A/D) converters. Background tuner 804-2 includes components similar to primary tuner 804-1, except that LNA 806-2 of background tuner may receive and amplify buffered signal 816 (as opposed to an RF signal directly from an antenna).

Each tuner 804 (i.e., tuner 804-1 and tuner 804-2) includes output buffer amplifier 810 (also referred to herein as output buffer) having an input port electrically coupled to the input port of LNA 806. Output buffer 810 is a buffer amplifier configured to provide suitable electrical impedance transformation. In primary tuner 804-1, output buffer 810-1 receives RF signal 812 from antenna 802 and outputs buffered signal 816. Buffered signal 816 is input to LNA 806-2 of background tuner 804-2.

Thus, RF signal 812 is provided to LNA 806-1 and to output buffer 810-1, in order to drive RF signal 812 off-chip to background tuner 804-2. In operation, primary tuner 804-1 may receive a desired channel from received RF signal 812, while background tuner 804-2 may scan alternate channels from the same RF signal 812.

This approach has several disadvantages. Background tuner 804-2 may only be used as a background tuner, unless external switches are used to connect tuner 804-2 to an antenna and to disconnect LNA 806-2 from buffer 810-1. The inclusion of LNA 806-2 on IC2 creates a duplication of power, because this function is already performed by primary tuner 804-1. Routing RF signal 812 (as buffered signal 816) to background tuner 804-2 may cause additional noise pickup by receiver 800, especially if the input is single-ended. Furthermore, output buffer 810-1 is used to drive a low-impedance RF input of background tuner 804-2, which is often matched to 50 ohms for frequency modulation (FM) and digital audio broadcasting (DAB) frequency bands. Thus, the configuration of receiver 800 may increase the buffer current used for output buffers 810. In addition, any buffer noise may directly add to the receiver noise figure.

An improved conventional receiver 820 is shown in FIG. 8B. Receiver 820 includes antenna 802, primary tuner 822-1 and secondary tuner 822-2. Tuners 822-1, 822-2 are similar to tuners 804-1, 804-2 in receiver 800 (FIG. 8A), except for the arrangement of output buffers 810-1, 810-2 within respective tuners 822-1, 822-2.

In tuners 822 of receiver 820, each output buffer 810 is positioned after LNA 806 (i.e., between LNA 806 and mixer 808). Thus, output buffer 810-1 of primary tuner 822-1 receives amplified RF signal 814 from LNA 806-1. Amplified RF signal 814 is buffered by output buffer 810-1 to form buffered signal 824, and provided to LNA 806-2 of background tuner 822-2.

The configuration of receiver 820 alleviates some of the disadvantages of receiver 800 (FIG. 8A). In particular, because buffered signal 824 is amplified (via LNA 806-1), buffered signal 824 may have increased noise pickup immunity. LNA 806-2 (in background tuner 822-2) may be set to unity gain, because buffered signal 824 is already amplified (by primary tuner 822-1). However, it is still desirable that LNA 806-2 have high enough current to maintain a low noise figure, such that LNA 806-2 does not impact the receiver noise. Furthermore, in receiver 820, primary tuner 822-1 and background tuner 822-2 are still dedicated to a fixed configuration, unless external switching is used. The fixed configuration of receiver 820 may limit its flexibility for a variety of uses.

Embodiments of the apparatus relate to tuners, multi-tuner receivers and methods of connecting multiple tuners of a receiver for various receiver operation states. An example tuner includes an RF amplifier configured to be coupled to an antenna to provide a received RF signal, a bidirectional port configured to be coupled to another tuner and a bidirectional port circuit coupled between the RF amplifier and the bidirectional port. The bidirectional port circuit may include signal routing circuitry and a programmable control that is configured to control the signal routing circuitry to implement one of an input port, an output port or a disabled port.

In some examples, the bidirectional port circuit may include one or more switches, such as switches arranged in a switching network capable of being programmed for various tuner port configurations. In some examples, the bidirectional port circuit may include at least one buffer amplifier and one or more switches capable of being programmed for various tuner port configurations. In some examples, the bidirectional port circuit may include an input buffer amplifier configured to receive an input signal from the other tuner via the bidirectional port and an output buffer amplifier configured to output the RF signal from the RF amplifier to the bidirectional port. Each of the input buffer amplifier and the output buffer amplifier may include the signal routing circuitry that may be controlled to enable one of the input buffer amplifier or the output buffer amplifier and to disable a remaining one of the input buffer amplifier or the output buffer amplifier, or to disable both the input buffer amplifier and the output buffer amplifier.

Example receivers include bidirectional ports for background tuners, that may be programmed as inputs, outputs or disabled, thus enabling a variety of use-cases which may be changed dynamically as needed by an application. Unlike current receivers, the same bidirectional port may be used as an input port or an output port on different chips. A receiver with its RF input port and bidirectional port connected has the ability to electrically switch between the two ports without any external switches. Two or more tuners may have their bidirectional ports connected to together. The number of connected tuners may depend upon the drive strength of the output ports.

In some examples, the unused ports may present a high-impedance to the signal to minimize loading. In some examples, the bidirectional port circuit may drive an input signal into a mixer input of the tuner. Thus, the bidirectional port circuit may drive a higher impedance and use less current compared with conventional background tuner buffers driving into the RF input.

Aspects of the described apparatus include using bidirectional ports for background tuners of automotive radios, in order to increase the flexibility, economy and performance of multi-tuner radio applications. Having bidirectional port circuits with programmable interchangeable input/output (i.e., bidirectional) ports may enable new receiver operation modes and possibilities that were not previously available. Embodiments also eliminate the disadvantages described above with respect to receivers 800 and 820 in FIGS. 8A and 8B. Example tuners may enhance receiver platform scalability and flexibility.

Referring to FIG. 1, a functional block diagram of an example multi-tuner receiver 100 is shown. Receiver 100 may include first antenna 102-1 (ANT1), second antenna 102-2 (ANT2), first tuner 104-1, second tuner 104-2 and controller 116. Controller 116 may be coupled to first tuner 104-1 and second tuner 104-2, to control a configuration of each tuner 104 to receive and output signals among radio input port 101 and bidirectional input/output (IO) port 103.

In FIG. 1, tuner 104-1 and tuner 104-2 are illustrated as being formed on respective first IC (IC1) and second IC (IC2). Although tuners 104-1, 104-2 are illustrated on separate ICs, in some examples, tuners 104-1, 104-2 may be disposed on a single IC. Although FIG. 1 illustrates receiver 100 with two tuners 104-1, 104-2, in some examples, receiver 100 may include two or more tuners 102 coupled to controller 116.

First antenna 102-1 may be coupled to first tuner 104-1 via radio input port 101-1, and second antenna 102-2 may be coupled to second tuner 104-2 via radio input port 101-2. First tuner 104-1 may be coupled to second tuner 104-2 via respective bidirectional IO ports 103-1, 103-2.

Each antenna 102 (i.e., antenna 102-1, antenna 102-2) may be configured to receive an RF signal in a predetermined frequency band. In one example, the RF signal may include a frequency modulation (FM) band. In another example, the RF signal may include a digital audio broadcasting (DAB) frequency band, such as the DAB-III band.

Each tuner 104 (i.e., tuner 104-1, tuner 104-2) may include LNA 106, mixer 108 and bidirectional port circuit 110. Although not shown, LNA 106 may also include an AGC. LNA 106 and mixer 108 are similar to LNA 806 and mixer 808 described above with respect to FIGS. 8A and 8B, and are not described further. Each tuner 104 may include additional components (not shown), such as a local oscillator (LO), IF filters (e.g., for channel selection), VGAs and A/D converters.

In general, each bidirectional port circuit 110 (i.e., bidirectional port circuit 110-1 and bidirectional port circuit 110-2) may include any suitable components to program respective bidirectional IO port 103 as one of an input port, an output port for a disabled port. In some examples, circuit 110 may include one or more amplifiers and/or switches (i.e., signal routing circuitry) configured to enable/disable connection between LNA 106, mixer 108 and bidirectional IO port 103. In some examples, circuit 110 may include one or more buffer amplifiers. In some examples, a single buffer amplifier and a switching network may be used, such as shown in bidirectional port circuit 110' (FIG. 4B). In some examples, circuit 110 may include one or more switches configured to enable/disable connection between LNA 106, mixer 108 and bidirectional IO port 103, without the use of buffer amplifiers, such as shown in bidirectional port circuit 110'' (FIG. 4C). In some examples, circuit 100 may include input and output buffer amplifiers, such as shown in FIGS. 4A, 5 and 6. Bidirectional port circuit 110 may be single-ended or differential. Although FIGS. 3A, 3B, 5 and 6 illustrate respective receivers 300, 320, 500, 600 with bidirectional port circuits having two buffer amplifiers, these configurations represent an example of bidirectional port circuit 100. Receivers 300, 320, 500, 600 may also include one buffer amplifier (such as shown in FIG. 4B) or may not include buffer amplifiers (such as shown in FIG. 4C).

Referring briefly to FIG. 4A, in one example, bidirectional port circuit 110 may include buffered port circuit 310. Each buffered port circuit 310 may include input buffer 401 and output buffer 403. Input buffer 401 may be configured to receive an input signal from bidirectional IO port 103 and output a buffered input signal to mixer 108. Output buffer 403 may be configured to receive an amplified RF signal from LNA 106 and output a buffered output signal to bidirectional IO port 103. Buffers 401, 403 may include any buffer amplifiers capable of providing suitable electrical impedance transformation and isolation. Buffers 401, 403 may have a unity gain, negative gain and/or positive gain. In some examples a gain of input buffer 401 may the same as output buffer 403. In some examples, the gain of input buffer 401 may be different from output buffer 403. In some examples, because buffered port circuit 310 drives into the input of mixer 108, buffered port circuit 310 may drive a higher impedance and may use decreased current as compared to conventional buffers driving an RF input.

Referring back to FIG. 1, controller 116 may be coupled to LNA 106 and bidirectional port circuit 110 of each tuner 104. Controller 116 may be configured to enable or disable LNA 106 via an LNA control signal. Controller 116 may also be configured to program bidirectional port circuit 110 via one or more port control signals. For example, controller 116 may be configured to enable or disable input buffer 401 (FIG. 4A) and output buffer 403 via respective input and output buffer control signals. Controller 116 may electrically set bidirectional IO port 103 as one of an input port (e.g., by enabling input buffer 401 (FIG. 4A) and disabling output buffer 403), an output port (e.g., by disabling input buffer 401 and enabling output buffer 403) or a disabled IO port 103 (e.g., by disabling both input buffer 401 and output buffer 403). Thus, controller 116 may electrically switch bidirectional IO port 103 between different states, without external switches. Example, selection of input/output/disablement states of bidirectional port circuit 110 is described further below with respect to FIG. 4A. Disablement of LNA and/or bidirectional port circuit 110, may cause the respective component to provide a high impedance input, to minimize impedance loading.

Controller 116 may be configured to select control signals for LNA 106 and bidirectional port circuit 110 according to predetermined tuner port configurations associated with different receiver operation states. Example tuner port configurations and operation states are described further below with respect to Tables 1 and 2. The predetermined tuner port configurations may be stored in a look up table (LUT) in a storage device, such as memory 214 (FIG. 2). Controller 116 may also be configured to select one of first tuner 104-1 or second tuner 104-2 as a primary tuner (e.g., second tuner 104-2) and a remaining tuner as a background tuner (e.g., first tuner 104-1). In some examples, the primary and background tuners may be switched between first tuner 104-1 and second tuner 104-2, via controller 116.

Components of receiver 100 may be implemented in hardware, software or a combination thereof. Suitable components for use within the remainder of receiver 100 (not shown) would be understood by one of skill in the art. These components may include audio amplifiers, equalizers, speakers and other components of a conventional radio receiver.

Referring to FIG. 2, a functional block diagram of a portion of an example multi-tuner receiver 200 is shown. Receiver 200 is similar to receiver 100 (FIG. 1), except that receiver 200 illustrates example control and data bus connections between first tuner circuit 202-1 on first IC (IC1), second tuner circuit 202-2 on second IC (IC2) and control circuit 204 on a host system on a chip (SOC). In FIG. 2, the control bus is represented by the thin double headed arrow line and the data bus is represented by the thicker single arrow line. FIG. 2 also illustrates that receiver 200 may include more than two tuner circuits 202. Although FIG. 2 illustrates tuner circuits 202-1 and 202-2 on separate ICs, in some examples, tuner circuits 202-1 and 202-2 may be formed on a single IC. In some examples, tuner circuits 202-1, 202-2 and control circuit 204 may be formed on a single IC. It is contemplated that either or both of the control bus and data bus may be a serial signal path or multiple parallel signal paths.

Each tuner circuit 202 (i.e., tuner circuit 202-1, tuner circuit 202-2) may include radio tuner 104 (as shown in FIG. 1), digital baseband (BB) processing component 206, data interface 208 and control interface 210. A digitized IF signal from radio tuner 104 may be provided to digital BB processor 206, for conversion of the IF signal to a baseband signal. The baseband signal may be output from tuner circuit 202 to control circuit 204 via data interface 208 and the data bus. Control interface 210 may be coupled to radio tuner 104 and digital baseband component 206, for receiving control signals from control circuit 204, via the control bus, to control operation of radio tuner 104 and baseband component 206.

Control circuit 204 may include data interface 212, controller 116, memory 214, control interface 216 and optional phase diversity processor 218. Control circuit 204 and/or tuners 202-1, 202-2 may include additional components (not shown), such as timing sources (e.g., oscillators, phase-locked loops), peripherals (e.g., counters, timers, reset generators), external interfaces, analog interfaces, voltage regulators and/or power management circuits.

Controller 116 may include, for example, a microcontroller, a microprocessor or a digital signal processor (DSP). Memory 214 may include any suitable non-transitory computer readable medium (e.g., storing software, storing data, storing predetermined tuner port configurations, etc.) for interacting with controller 116. Memory 214 may store predetermined tuner port configurations for radio tuners 104-1, 104-2. Memory 214 may include, without being limited, to read only memory (ROM), random access memory (RAM), electrically erasable programmable ROM (EEPROM) or flash memory.

Control circuit 204 may include data interface 212 for receiving data from tuner circuits 202-1, 202-2, via the data bus. In some examples, the received data may be used by controller 116 to set the tuner port configuration (e.g., stored in memory 214) for each radio tuner 104-1, 104-2, based on a desired receiver operation state. In some examples, the received data may also be used by controller 116 to select one of tuner circuits 202 as the primary tuner (e.g., tuner circuit 202-2) and a remaining tuner circuit 202 as the background tuner (e.g., tuner circuit 202-1).

Control circuit 204 may include control interface 216 for outputting control signals to tuner circuits 202, via the control bus. Controller 116 may use the control signals to set the configuration of radio input port 101 (FIG. 1) and buffer IO port 103 of each radio tuner 104, based on a selected predetermined tuner port configuration. Control circuit 204 may also include demodulation circuitry. Thus, in some examples, controller 116 may select an audio data stream to be processed for presentation to a user.

In some examples, controller 116 may include optional diversity processor 218. Diversity processor 218 may perform phase diversity processing of the received RF signals (e.g., from antennas 102-1, 102-2 shown in FIG. 1), to alleviate multipath dropout. Multipath dropout may occur when both a direct RF signal and a reflection of the signal arrive at the same antenna 102. Because the reflected signal travels farther than the direct signal, the reflected signal arrives later than the direct signal and may be out of phase with the direct signal. Multipath interference may produce signal loss and/or a reduced signal level arriving at the receiver antenna 102.

Diversity processor 218 may process and combine each received antenna signal (e.g., received RF signals from antennas 102-1 and 102-2) according to phase diversity techniques. Diversity processor 218 may monitor the phase relationship between antennas 102-1, 102-2 based on the received RF signals. In the event of a signal interruption from a partial phase cancellation (multipath) or total phase cancellation (drop-out), diversity processor 218 may adjust the phase of one of the signals from antennas 102-1, 102-2 to a positive condition relative to the other antenna, and may continually adjust the phase of one or more of the antenna signals for an optimum signal. Phase diversity techniques are described in an article by Reiter et al., entitled "Antenna-Diversity Techniques in Cars for FM-Radio, TV and Cellular Phone," European Microwave Conference; 29; pages 147-150, the description of which is incorporated herein.

In some examples, controller 116 may analyze the incoming signal strength level of the received antenna signal from at least one of antennas 102-1, 102-2. Depending upon the signal strength, controller 116 may switch the configuration of tuner circuits 202-1, 202-2 between phase diversity and background tuner modes (described further below with respect to FIG. 7).

It should be noted that the processes performed by controller 116 and optional diversity processor 218 may be stored in memory 214 which may include software that controller 116 and/or diversity processor 218 executes to determine the signal strength level of the received RF signals, perform optional diversity processing and to generate the control signals for setting tuner port configurations for tuners 104-1, 104-2.

Components of receiver 200 may be implemented in hardware, software or a combination thereof. Suitable components for use with receiver 200 may be understood by one of skill in the art from the description herein.

It should be noted, that, although the circuit in FIG. 1 is shown as single ended, it could also be differential. More specifically, differential configurations (e.g., where LNA 106, mixer 108 and bidirectional port circuit 110 have differential input/output terminals) may be implemented for low noise operation.

Referring to FIGS. 3A and 3B, functional block diagrams of example differential configurations of receiver 300 and 320 are shown. In particular, FIG. 3A illustrates receiver 300 having a single-ended RF signal input; and FIG. 3B illustrates receiver 320 having a differential RF signal input. Receivers 300, 320 are similar to receiver 100 (FIG. 1) except that receivers 300, 320 are differential configurations. Although not shown, receivers 300, 320 may also include controller 116 (FIG. 1) coupled to respective tuners 304, 324. The selection of tuner port configurations in receivers 300, 320 is similar to that of receiver 100 described herein. Receivers 300, 320 are also similar to receiver 100 (FIG. 1) except that receivers 300, 320 illustrate buffered bidirectional port circuits 310.

In FIG. 3A, receiver 300 includes first antenna 102-1 coupled to first tuner 304-1 and second antenna 102-2 coupled to second tuner 304-2 in a single ended configuration. Each tuner 304 includes LNA 306, mixer 308 and buffered bidirectional port circuit 310. LNA 306, mixer 308 and bidirectional port circuit 310 are similar to LNA 106, mixer 108 and bidirectional port circuit 110 shown in FIG. 1, except that they have a differential configuration. In addition, LNA 306 may be configured to convert a single-ended RF signal (from antenna 102) to a differential signal. First tuner 304-1 is coupled to second tuner 304-2 via respective differential bidirectional port circuits 310-1, 310-2.

In FIG. 3B, receiver 320 includes first antenna 102-1 coupled to first tuner 324-1 via filter 322-1; and second antenna 102-2 coupled to second tuner 324-2 via filter 322-2. The received single-ended RF signal is converted by filter 322 to a differential RF signal. In some examples, filter 322 may include a balun. Each tuner 324 includes LNA 326, mixer 308 and bidirectional port circuit 310. LNA 326 is similar to LNA 306 except that LNA 306 may receive a differential RF signal (from filter 322). The configuration of tuners 324-1, 324-2 are similar to tuners 304-1, 304-2 except that tuners 324-1, 324-1 may be configured to receive a differential RF signal.

Referring to FIG. 4A, a circuit diagram of differential buffered bidirectional port circuit 310 (i.e., circuit 310-1 or circuit 310-2) is shown. Differential buffer inputs and outputs may be used to reject common-mode noise from the IC and from a receiver platform. Although a differential configuration of bidirectional port circuit 310 is shown, it is understood that a single-ended buffered configuration, such as bidirectional port circuit 610 shown in FIG. 6, has a similar configuration and operation. Thus the description below for differential buffer 310 is also relevant for single-ended bidirectional buffer 610.

Circuit 310 may include input buffer 401 in a back-to-back configuration with output buffer 403. Signal lines 408 may be electrically coupled to LNA 306 (LNA 326 or LNA 106 for a single-ended configuration) and mixer 308 (or mixer 108). Signal lines 410 may be electrically coupled to bidirectional IO port 103. Bidirectional port circuit 310 may also include switches 404 and 406. Switches 404 and 406 represent an example of signal routing circuitry configured to be programmed by controller 116 to implement one of an input port, an output port or a disabled port. Switches 404 and 406 represent a logical function and may not necessarily represent physical switches. For example, the switching function may be implemented by digital gates controlling bias enables.

Input buffer 401 may be enabled or disabled via control signal 412 from controller 116 that is configured to open or close switches 404. Switches 404 may be coupled to predetermined bias value 402-1. In operation, when both switches 404 and 406 are opened, input buffer 401 may be enabled to receive a signal from bidirectional IO port 103 (FIG. 1) and provide the input signal to mixer 306 (106). When both switches 404 and 406 are closed, input buffer 401 is disabled, and the output of input buffer 401 is set to predetermined bias value 402-1. Predetermined bias value 402-1 may be used to maintain receiver linearity when input buffer 401 is disabled.

Output buffer 403 may be enabled or disabled via control signal 414 from controller 116 that is configured to open or close switches 406. In operation, when both switches 406 and 404 are closed, output buffer 403 may be enabled to output a signal to bidirectional IO port 103 (FIG. 1) that is received from LNA 306 (326 or 106). Predetermined bias value 402-2 may be used to maintain receiver linearity when output buffer 403 is enabled. When switches 406 are opened, output buffer 403 may be disabled.

Bidirectional port circuit 310 includes one buffer (input buffer 401) dedicated for input and another buffer (output buffer 403) dedicated for output. Circuit 310 may be configured so that i) only one direction may be turned on at a time and ii) both input buffer 401 and output buffer 403 may be disabled at the same time.

In some examples, input and output buffers 401, 403 may be configured to provide high forward isolation and high reverse isolation such that when buffers 401, 403 are disabled only a desired signal is received at the input of mixer 308 (108). Buffers 401, 403 may also be configured for low noise (e.g., low enough not to impact the receiver noise figure) and high linearity, in order to have a negligible impact on the receiver performance. It may be desirable that circuit 310 (110) provide enough drive capability for any output drivers driving off-chip to drive a load of capacitance of board traces and an input impedance of other chips that are being driven. In some examples, circuit 310 (110) may be configured to provide a high impedance at both ends (i.e., at signal side 408 and signal side 410) when bidirectional port circuit 310 (110) is turned off (e.g., an impedance much greater than the input impedance of mixer 308 (108)), such that bidirectional port circuit 310 (110) does not load down the signal. Furthermore, for high-linearity applications, it may be desirable that the impedance be independent of the amplitude of the incident RF signal.

In some examples, buffers 401, 403 may include operational amplifier-based buffer circuits. In general, any suitable circuit topology of buffers 401, 403 having desired impedance, linearity and noise characteristics may be used. For high-linearity applications such as FM, careful disabling is desired, that does not impact the receiver linearity when buffers 401, 403 are disabled. For example, when input buffer 401 is disabled, it may ramp down to the predetermined bias 404-1. In some examples, input buffer 401 and/or output buffer 403 may include unity gain. In some examples, input buffer 401 and/or output buffer 403 may include positive gain (or negative gain) to compensate for any transmission losses (e.g., which may be a one or more decibels).

Although FIG. 4A illustrates bidirectional port circuit 310 with two buffer amplifiers, in some examples, the bidirectional port circuit may include one buffer amplifier. For example, FIG. 4B illustrates an example bidirectional port circuit 110' including single buffer amplifier 420 and switching network 422. In some examples, buffer amplifier 420 may include a bidirectional buffer amplifier circuit. Switching network 422 may include one or more switches to configure buffer amplifier 420 in an input mode, an output mode or a disabled mode. Switching network 422, via controller 116, may enable/disable connection(s) between LNA 106, mixer 108 and bidirectional IO port 103. Switching network 422 represent an example of signal routing circuitry configured to be programmed by controller 116 to implement one of an input port, an output port or a disabled port.

Although, FIGS. 4A and 4B illustrate bidirectional port circuits 310, 110' with at least one buffer amplifier, in some examples, the bidirectional port circuit may not include any buffer amplifiers. For example, LNA 106 may provide suitable gain and/or enough drive capability that buffering may not be needed. FIG. 4C illustrates an example bidirectional port circuit 110" including switching network 422' having one or more switches. Switching network 422' may be configured to receive a control signal from controller 116, to enable/disable connection(s) between LNA 106, mixer 108 and bidirectional IO port 103 (e.g., by opening or closing one or more suitably connected switches). Switching network 422' represent an example of signal routing circuitry configured to be programmed by controller 116 to implement one of an input port, an output port or a disabled port.

Referring back to FIG. 1, an example operational use of receiver 100 as an FM background tuner with antenna switching is described. When antenna ports 101-1, 101-2 are coupled to respective antennas 102-1, 102-2, and bidirectional IO ports 103-1, 103-2 are coupled to first and second tuners 104-1, 104-2, a background tuner may be switched between first antenna 102-1 (ANT1) and second antenna 102-2 (ANT2). Furthermore, controller 116 may interchange the primary and background tuners between first and second tuners 104-1, 104-2. Antenna switching may be performed in receiver 100 by controller 116 via selective enablement/disablement among radio input ports 101-1, 101-2 and buffer IO ports 103-1 103-2 (without external switches). In contrast, current methods require external switches, which add cost and possible loss to the platform.

Table 1 below shows example LNA 106 (and consequently antenna 102) and bidirectional port circuit 110 conditions for each tuner 104-1, 104-2 for various receiver operation states. The receiver operation states may include selection of primary and background tuners among first tuner 104-1 and second tuner 104-2, as well as and antenna switching between first antenna 102-1 and second antenna 102-2 for the selected background tuner. In table 1, LNA1 and LNA2 refers to LNA 106 of respective tuners 104-1 and 104-2. IO Port 1 and IO Port 2 refer to programming of IO ports 103-1, 103-2 provided by respective bidirectional port circuits 110-1 and 110-2.

TABLE 1

Background tuner with antenna switching

| Use Case | ANT1/ LNA1 | ANT2/ LNA2 | IO Port 1 | IO Port 2 |
|---|---|---|---|---|
| 1$^{st}$ tuner as primary with ANT1 2$^{nd}$ tuner as background with ANT1 | Enabled | Disabled | Output | Input |
| 1$^{st}$ tuner as primary with ANT1 2$^{nd}$ tuner as background with ANT2 | Enabled | Enabled | Disabled | Disabled |
| 1$^{st}$ tuner as background with ANT1 2$^{nd}$ tuner as primary with ANT2 | Enabled | Enabled | Disabled | Disabled |
| 1$^{st}$ tuner as background with ANT2 2$^{nd}$ tuner as primary with ANT2 | Disabled | Enabled | Input | Output |

As can be seen in Table 1, bidirectional port circuit 110 may be used for a background tuner in an automotive radio. The ability to enable/disable tuner ports via bidirectional port circuit 110 provides a unique method of connectivity between primary and background tuners. This connectivity may provide flexibility in the receiver configuration.

Another example operational use of receiver 100 also includes a configuration as an FM radio with two tuner phase diversity or as a background tuner with antenna switching. In a weak signal environment, first and second tuners 104-1, 104-2 may be connected to two independent antennas 102-1, 102-2 that may be used for phase diversity. In a strong signal environment, either one of tuner 104-1 or tuner 104-2 may be used as a background tuner. Furthermore, the background tuner may select its own antenna or the antenna of the other tuner (via controller 116). Thus, receiver 100 may switch between two antennas 102-1, 102-2 without any external switches. In contrast, current antenna switching methods require at least three tuners. Table 2 below shows example LNA 106 (and consequently antenna 102) and bidirectional port circuit 110 conditions for phase diversity and various antenna matching receiver states.

TABLE 2

Phase Diversity mode or background tuner with antenna switching

| Use Case | ANT1/ LNA1 | ANT2/ LNA2 | IO Port 1 | IO Port 2 |
|---|---|---|---|---|
| 1$^{st}$ and 2$^{nd}$ tuners in phase diversity mode | Enabled | Enabled | Disabled | Disabled |
| 1$^{st}$ tuner as primary with ANT1 2$^{nd}$ tuner as background with ANT1 | Enabled | Disabled | Output | Input |
| 1$^{st}$ tuner as primary with ANT1 2$^{nd}$ tuner as background with ANT2 | Enabled | Enabled | Disabled | Disabled |
| 1$^{st}$ tuner as background with ANT1 2$^{nd}$ tuner as primary with ANT2 | Enabled | Enabled | Disabled | Disabled |
| 1$^{st}$ tuner as background with ANT2 2$^{nd}$ tuner as primary with ANT2 | Disabled | Enabled | Input | Output |

For example if second tuner 104-2 is switched from a phase diversity mode to a background tuner mode using first antenna 102-1, LNA 106 of second tuner 104-2 (i.e., LNA2) is turned off (i.e., disabled) with its output in high impedance mode, and bidirectional port circuit 110-2 is turned on in INPUT mode. In addition, bidirectional port circuit 110-1 is turned on in OUTPUT mode. In this configuration, the selected background tuner (e.g., tuner 104-2) may receive the amplified RF signal from antenna 102-1 via first (primary) tuner 104-1.

The background tuner of tuner 104-2 may also be switched to receive a RF signal from second antenna 102-2 (ANT2) if desired. For example, controller 116 may turn on (i.e., enable) LNA 106 in second tuner 104-2 (i.e., LNA2) and turn off (i.e., disable) both bidirectional port circuits 104-1 and 104-2.

Referring to FIG. 7, a method for switching a multi-tuner receiver between phase diversity and background tuner modes is described. The method is described with reference to FIG. 1. It is understood that FIG. 7 represents an example method for switching tuner modes, and that other methods of switching tuner modes may be possible using receiver 100.

At step 700, a signal is received from at least one of antennas 102-1, 102-2, for example, by controller 116. At step 702, controller 116 may determine a signal strength of the received signal(s). At step 704, controller 116 may determine whether the signal strength is greater than a predetermined threshold.

If controller 116 determines, at step 704, that the signal strength is greater than the predetermined threshold, step 704 proceeds to step 706. At step 706, controller 116 may select one of first and second tuners 104-1, 104-2 as a primary tuner. At step 708, controller 116 may select a remaining one of first and second tuners 104-1, 104-2 as a background tuner. At step 710, controller 116 may select one of first and second antennas 102-1, 102-2 as the antenna of the selected background tuner. At step 712, controller 116 may apply the selected configuration (steps 706-710) to tuners 104-1, 104-2 via control signals to LNA 106 and bidirectional port circuit 110 of each tuner 104-1, 104-2, such as shown in Table 2. The applied control signals may control enablement/disablement of radio input ports 101-1, 101-2 and bidirectional IO ports 103-1, 103-2. Step 712 may proceed to step 700.

If controller 116 determines, at step 704, that the signal strength is less than or equal to the predetermined threshold, step 704 proceeds to step 714. At step 714, first and second tuners 104-1, 104-2 are configured in phase diversity mode, e.g., as shown in Table 2. At step 716, the received antenna signals may be processed according to phase diversity techniques, such as via optional diversity processor 218 (FIG. 2). Step 716 may proceed to step 700.

The above examples illustrate single band receivers. In some examples, the receiver may include a multiband multi-tuner receiver. Referring to FIG. 5, a functional block diagram of example multiband multi-tuner receiver 500 is shown. Receiver 500 may include first band1 antenna 502-1 (DAB1) and first band2 antenna 504-1 (FM1) coupled to first multiband tuner 506-1. Receiver 500 may also include second band1 antenna 502-2 (DAB2) and second band2 antenna 504-2 (FM2) coupled to second multiband tuner 506-2. Although not shown, receiver 500 may include controller 116 (FIG. 1) coupled to first multiband tuner 506-1 and second multiband tuner 506-2, to control a configuration of each tuner 506 to receive and output signals among radio input ports, band1 (buffered) bidirectional IO port 503 and band2 (buffered) bidirectional IO port 505. First tuner 506-1 is coupled to second tuner 506-2 via respective Band1 (buffered) bidirectional IO ports 503-1, 503-2 and band2 (buffered) bidirectional IO ports 505-1, 505-2.

In FIG. 5, band1 represents a DAB-III frequency band and band2 represents an FM frequency band. It is understood that FIG. 5 represents an example, and that receiver 500 may be configured to receive and process two or more different frequency bands.

In FIG. 5, tuner 506-1 and tuner 506-2 are illustrated as being formed on respective first IC (IC1) and second IC (IC2). Although tuners 506-1, 506-2 are illustrated on separate ICs, in some examples, tuners 506-1, 506-2 may be disposed on a single IC. Although FIG. 5 illustrates receiver 500 with two tuners 506-1, 506-2, in some examples, receiver 500 may include two or more tuners 506 coupled to controller 116.

Each tuner 506 (i.e., tuner 506-1, tuner 506-2) includes band1 LNA 508 to receive a band1 signal from band1 antenna 502, band1 mixer 510 coupled to band1 LNA 508 and band1 bidirectional port circuit 516. Each of components 508, 510 and 516 process the band1 signal from band1 antenna 502.

Each tuner 506 also includes band2 LNA 512 to receive a band2 signal from band2 antenna 504, band2 mixer 514 coupled to band2 LNA 512 and band2 bidirectional port circuit 518. Each of components 512, 514 and 518 process the band2 signal from band2 antenna 504.

Band1 and band2 IF signals from respective mixers 510, 514 may be provided to baseband component 520 for conversion of each IF signal to a baseband signal. LNA 508, 512, mixers 510, 514 and bidirectional port circuits 516, 518 are similar to LNA 106, mixer 108 and bidirectional port circuit 110 of tuner 104 (FIG. 1), except that the respective components in receiver 500 may be applied to two different frequency band signals. The operation of receiver 500 with predetermined tuner port configurations associated with different receiver operation states is similar to the description of FIG. 1 and shown in Tables 1 and 2. A difference between receiver 100 (FIG. 1) and receiver 500 (FIG. 5) is that receiver 500 with bidirectional port circuits 516, 518 may be used for multiple bands.

The above examples illustrate the use of two tuners in a receiver. Next, an example receiver having three tuners, and its possible receiver operation modes is described.

Referring to FIG. 6, a functional block diagram of an example multi-tuner receiver 600 is shown. Receiver 600 may include three tuners 104-1, 104-2 and 104-3 for both phase diversity and background antenna switching. Although not shown, receiver 600 may include controller 116 coupled to each of tuners 104-1, 104-2, 104-3 to control enablement/disablement of radio input ports 101-1 and 101-2 and bidirectional IO ports 103-1, 103-2 and 103-3. The control of tuner ports may be based on predetermined tuner port configurations associated with different receiver operation states (described further below). Bidirectional port circuit 610 of each tuner 104 represents an example of bidirectional port circuit 110 configured to provide a buffered signal (i.e., IO Buffer). The remaining components of tuners 104-1, 104-2, 104-3 are the same as described above with respect to FIG. 1 and, thus, will not be described further. Although tuners 104-1, 104-2, 104-3 are illustrated on separate ICs (respective IC1, IC2 and IC3), in some examples, two or more of tuners 104-1, 104-2 and 104-3 may be disposed on a single IC.

First tuner 104-1 may be coupled to first antenna 102-1 (ANT1) and second tuner 104-2 may be coupled to second antenna 102-2 (ANT2). Third tuner 104-3 may not be directly coupled to an antenna, but may be switchably coupled to first antenna 102-1 or second antenna 102-2. Tuners 104-1, 104-2 and 104-3 may be coupled to each other via respective bidirectional IO ports 103-1, 103-2, 103-3. In an example operation, controller 116 (FIG. 1) may control enablement/disablement of input and output buffers of each bidirectional port circuit 610-1, 610-2, 610-3 to select the configuration of respective bidirectional IO ports 103-1, 103-2, 103-3.

In operation, first tuner 104-1 and second tuner 104-2 may be used for phase diversity reception. Third tuner 104-3 may be selected as a background tuner capable of antenna switching (between first antenna 102-1 and second antenna 102-2). Table 3 illustrates example receiver operation states and associated tuner port configurations for receiver 600. By having three tuners 104-1, 104-2, 104-3 with respective bidirectional port circuits 610-1, 610-2, 610-3, receiver 600 may provide guaranteed phase diversity (i.e., phase diversity processing is always available) as well as background tuner operation with antenna switching capabilities (between antennas 102-1 and 102-2).

TABLE 3

Guaranteed phase diversity and background tuner switching

| Use Case | ANT1/ LNA1 | ANT2/ LNA2 | LNA3 | IO Buffer1 | IO Buffer2 | IO Buffer3 |
|---|---|---|---|---|---|---|
| $1^{st}$ and $2^{nd}$ tuners for phase diversity; $3^{rd}$ tuner as background tuner with ANT1 | Enabled | Enabled | Disabled | Output | Disabled | Input |
| $1^{st}$ and $2^{nd}$ tuners for phase diversity; $3^{rd}$ tuner as background tuner with ANT2 | Enabled | Enabled | Disabled | Disabled | Output | Input |

Example receivers 100 (FIG. 1) and 600 (FIG. 6) illustrates an advantage in automotive radio platform scalability. Because two or more tuners 104 may be connected together (and in some cases buffered) via bidirectional IO ports 103, customers may be provided with a choice between i) two tuners (FIG. 1) capable of providing phase diversity in weak signal environments or background antenna switching in strong signal environments or ii) three tuners (FIG. 6) with phase diversity and background antenna switching, which is currently an assembly option instead of a board design option.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A tuner on an integrated circuit, the tuner comprising:
   a radio frequency (RF) amplifier configured to be coupled to an antenna to amplify an RF signal received from the antenna;
   a bidirectional port configured to be coupled to an other tuner; and
   a bidirectional port circuit coupled between the RF amplifier and the bidirectional port,
   wherein the bidirectional port circuit includes signal routing circuitry and a programmable control, the programmable control configured to control the signal routing circuitry to implement one of an input port, an output port or a disabled port.

2. The tuner of claim 1, wherein the bidirectional port circuit includes at least one buffer amplifier.

3. The tuner of claim 1, wherein the RF amplifier includes a further programmable control configured to enable the RF amplifier to receive the RF signal from the antenna.

4. The tuner of claim 1, wherein the tuner is configured to receive the RF signal in a predetermined frequency band, the predetermined frequency band including at least one of a frequency modulation (FM) band or a digital audio broadcasting (DAB) band.

5. The tuner of claim 1, wherein the RF signal includes first and second RF signals corresponding to different frequency bands, and the tuner includes first and second tuners on the integrated circuit configured to receive the respective first and second RF signals.

6. The tuner of claim 1, wherein the bidirectional port circuit is configured to output the amplified RF signal from the RF amplifier to the bidirectional port when the bidirectional port is programmed as the output port.

7. The tuner of claim 1, further comprising a mixer coupled to the RF amplifier, wherein the bidirectional port circuit is coupled to the mixer and is configured to provide an input signal from the other tuner to the mixer when the bidirectional port is programmed as the input port.

8. The tuner of claim 1, wherein the bidirectional port circuit includes:
an input buffer amplifier configured to receive an input signal from the other tuner via the bidirectional port, and
an output buffer amplifier configured to output the amplified RF signal from the RF amplifier to the bidirectional port,
wherein each of the input buffer amplifier and the output buffer amplifier includes the programmable control, the programmable control configured to cause the signal routing circuitry to enable one of the input buffer amplifier or the output buffer amplifier and to disable a remaining one of the input buffer amplifier or the output buffer amplifier, or to disable both the input buffer amplifier and the output buffer amplifier.

9. The tuner of claim 8, wherein the signal routing circuitry includes:
a first switch coupled to an output port of the input buffer amplifier, the first switch configured to enable or disable the input buffer amplifier responsive to a control signal; and
a second switch between the output buffer amplifier and the bidirectional port, the second switch configured to enable or disable the output buffer amplifier responsive to the control signal.

10. A multi-tuner receiver comprising:
a controller; and
first and second tuners coupled to respective first and second antennas and to the controller, each tuner of the first and second tuners including:
a radio frequency (RF) amplifier configured to amplify a received RF signal from a corresponding one of the first and second antennas, and
a bidirectional port circuit coupled between the corresponding RF amplifier and a bidirectional port of the respective tuner, the bidirectional port circuit including signal routing circuitry and a programmable control configured to control the signal routing circuitry to implement one of an input port, an output port or a disabled port,
wherein the first tuner is coupled to the second tuner via their respective bidirectional ports,
the controller is configured to select a tuner port configuration of each of the first tuner and the second tuner based on an associated receiver operation state, and
the controller, for each tuner, is configured to control the signal routing circuitry, based on the selected tuner port configuration.

11. The multi-tuner receiver of claim 10, wherein the controller, for each tuner, is configured to enable the corresponding RF amplifier to receive the respective RF signal from the corresponding one of the first and second antennas, based on the selected tuner port configuration.

12. The multi-tuner receiver of claim 11, wherein the controller is configured to select one tuner of the first and second tuners as a primary tuner and a remaining tuner of the first and second tuners as a background tuner.

13. The multi-tuner receiver of claim 12, wherein the controller is configured to switch signal communication to the background tuner between the first and second antennas via respective control signals to the bidirectional port circuit and the RF amplifier of each tuner.

14. The multi-tuner receiver of claim 10, wherein the controller is configured to:
determine a signal strength of the received RF signal from at least one tuner of the first and second tuners;
configure tuners among the first and second tuners as respective primary and background tuners, when the signal strength is greater than a predetermined threshold; and
configure the first and second tuners in a phase diversity arrangement, when the signal strength is less than the predetermined threshold.

15. The multi-tuner receiver of claim 10, wherein, the multi-tuner receiver is configured to receive each RF signal in at least one predetermined frequency band, the at least one predetermined frequency band including at least one of a frequency modulation (FM) band or a digital audio broadcasting (DAB) band.

16. The multi-tuner receiver of claim 10, further comprising:
a third tuner having a respective bidirectional port circuit and a respective bidirectional port, the third tuner coupled to the controller and to the respective bidirectional ports of the first and second tuners via the bidirectional port of the third tuner, the controller being configured to switch signal communication to the third tuner among the first and second antennas of the respective first and second tuners.

17. The multi-tuner receiver of claim 16, wherein the first and second tuners are configured in a phase diversity arrangement.

18. A method for configuring a plurality of tuners of a receiver, each tuner including a radio frequency (RF) amplifier configured to amplify an RF signal from a corresponding antenna, and a bidirectional port circuit coupled between the corresponding RF amplifier and a bidirectional port of the respective tuner, each bidirectional port circuit including signal routing circuitry and a programmable control configured to control the respective signal routing circuitry, the plurality of tuners coupled together via their respective bidirectional ports, the method comprising the steps of:
selecting, by a controller, a tuner port configuration for an associated receiver operation state;
sending, by the controller, a control signal to each tuner of the plurality of tuners to program each tuner based on the selected tuner port configuration;
configuring each tuner, responsive to the respective control signal, to control the signal routing circuitry to implement one of an input port, an output port or a disabled port; and
directing at least one received RF signal among the plurality of tuners responsive to configuring each tuner.

19. The method of claim 18, the method further comprising:
determining, by the controller, a signal strength of the at least one received RF signal from among the two tuners;

configuring, by the controller, two tuners among the plurality of tuners as respective primary and background tuners, when the signal strength is greater than a predetermined threshold; and configuring, by the controller, the two tuners in a phase diversity arrangement, when the signal strength is less than the predetermined threshold.

20. The method of claim 19, wherein the receiver includes a further tuner having a respective bidirectional port circuit and a respective bidirectional port, the further tuner coupled to the controller and to the respective bidirectional ports of the two tuners via the bidirectional port of the further tuner, wherein the method further comprises:

configuring, by the controller, the primary tuners and the further tuner in a phase diversity arrangement.

* * * * *